(12) United States Patent
Corr

(10) Patent No.: US 7,596,483 B1
(45) Date of Patent: Sep. 29, 2009

(54) DETERMINING TIMING OF INTEGRATED CIRCUITS

(75) Inventor: William Eric Corr, Twickenham (GB)

(73) Assignee: LSI Corporation, Milpitas, CA (US)

( * ) Notice: Subject to any disclaimer, the term of this patent is extended or adjusted under 35 U.S.C. 154(b) by 1826 days.

(21) Appl. No.: 09/344,169

(22) Filed: Jun. 24, 1999

(30) Foreign Application Priority Data

Jul. 2, 1998 (GB) ................... 9814379.5

(51) Int. Cl.
G06F 17/50 (2006.01)
(52) U.S. Cl. ................ 703/15; 703/14; 703/19
(58) Field of Classification Search ............ 703/13–15, 703/19; 716/4–5
See application file for complete search history.

(56) References Cited

U.S. PATENT DOCUMENTS 5,596,506 A * 1/1997 Petschauer et al. ............ 716/5
5,983,006 A * 11/1999 Carlson et al. ................. 716/4

OTHER PUBLICATIONS

Gao et al.; "Minimum crosstalk channel routing"; IEEE Trans CAD of ICs & Syst.; pp. 465-474; May 1996.*

* cited by examiner

Primary Examiner—Hugh Jones
(74) Attorney, Agent, or Firm—William W. Cochran; Cochran Freund & Young LLC

(57) ABSTRACT

The present invention is directed to determining the timing for a synchronous integrated circuit, the circuit including a multiplicity of clocked elements interconnected by signal paths. Predictions are formed for timing delays in said signal paths in the integrated circuit. A first such path is selected, wires are traced in the integrated circuit forming the path, hereinafter referred to as victim wires, and adjacent and crossing wires thereto, hereinafter referred to as aggressor wires, are determined. For each aggressor wire, the amount of electromagnetic coupling to the victim wires of the first path is determined. The aggressor wires are divided into a plurality of categories depending on the clocked timing of the aggressor wires in relation to the clocked timing of the victim wires. A user is allowed to select a mode of operation, and for each victim wire, the timing delay predictions are modified based on the effects of the aggressor wires only in those categories corresponding to the mode of operation selected by the user.

16 Claims, 4 Drawing Sheets

– PRIOR ART –
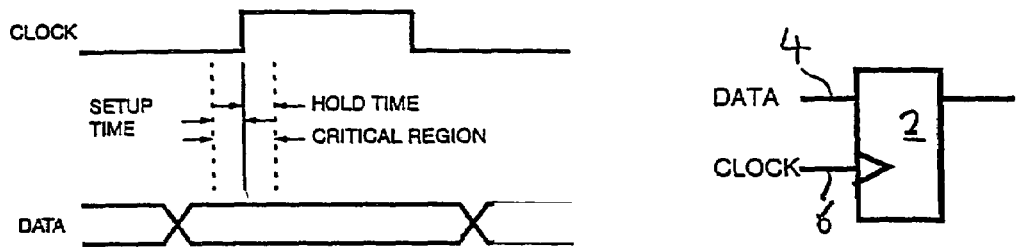
Figure 1. Traditional Static Timing analysis
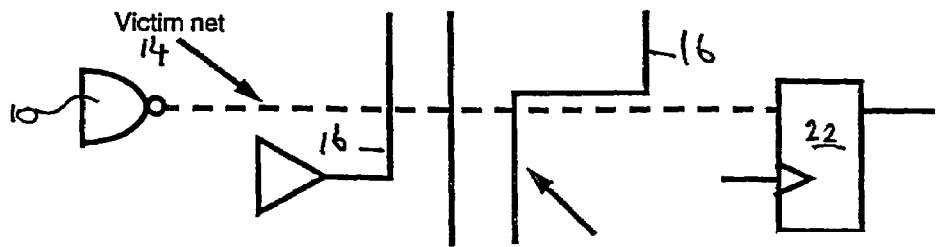
Figure 2, Examining Topological information
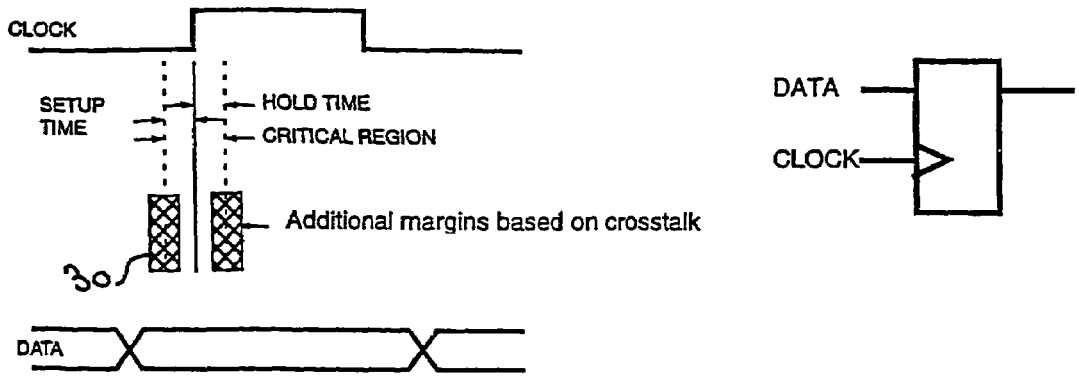
Figure 3,. Static Timing analysis with crosstalk back-annotation

DETERMINING TIMING OF INTEGRATED CIRCUITS

The present invention relates to a method and means for determining timings of operation of the various elements in a synchronous integrated circuit.

Static timing analysis tools are usually constructed as program that runs on a computer system which reads and writes information from a database which contains information on the logical and physical construction of an integrated circuit. This type of program is typically referred to as a "design tool".

Conventional static analysis tools determine whether storage devices will work reliably by looking at the predicted timing delays between their clock and data pins switching. If the difference in time between the signal switching at the pins is smaller than the device can tolerate, it may become "metastable", that is its output becomes indeterminate which would cause problems for other circuit elements and unreliable system operation.

The disadvantage of such tools is that they assume that all signal propagate around the die of an integrated circuit with a speed that is governed only by the dimensions of the wire and the strength of the driving element. Unfortunately, in complex integrated circuits this is not strictly true. Many wires cross or run parallel to each signal wire, and any switching activity in these wires may perturb the flight time of a signal in the victim wire. This effect is known as "crosstalk" and is a dynamic effect. It depends on switching activity. Conventional timing analysis is static, it does not require any switching information to determine whether or not the integrated storage elements will work reliably. Thus, it is open to making incorrect assumptions about the time signals take to travel around the chip and will not reliably predict which paths really are likely to cause timing problems.

SUMMARY OF THE INVENTION

It is an object of the invention to provide a method and means for improving the operation of synchronous integrated circuits and alleviating the effects of dynamic crosstalk.

In the first aspect, the present invention provides a method of determining the timing for a synchronous integrated circuit, the circuit including a multiplicity of clocked elements interconnected by signal paths, the method comprising:
1) forming predictions for timing delays in said signal paths in the integrated circuit;
2) selecting a first such path, tracing wires in the integrated circuit forming the path (hereinafter referred to as victim wires) and determining adjacent and crossing wires thereto (hereinafter referred to as aggressor wires);
3) for each aggressor wire, determining the amount of perturbation coupling to the victim wires of the first path;
4) dividing the aggressor wires into a plurality of categories depending on the clocked timing of the aggressor wires in relation to the clocked timing of the victim wires;
5) adding margins of error to the clocked timing of the victim wires in dependence upon the number of aggressor wires in one or more of said categories.

In a second aspect, the present invention provides apparatus for determining the timing of a synchronous integrated circuit, the circuit including a multiplicity of clocked elements interconnected by signal paths, the apparatus comprising:
1) means for forming predictions for timing delays in said signal paths in the integrated circuit;
2) means for selecting a first such path, tracing wires in the integrated circuit forming the path (hereinafter referred to as victim wires) and determining adjacent and crossing wires thereto (hereinafter referred to as aggressor wires);
3) means for determining the amount of coupling, for each aggressor wire, to the victim wires of the first path;
4) means for dividing the aggressor wires into a plurality of categories depending on the clocked timing of the aggressor wires in relation to the clocked timing of the victim wires;
5) means for adding margins of error to the clocked timing of the victim wires in dependence upon the number of aggressor wires in one or more of said categories.

BRIEF DESCRIPTION OF THE DRAWINGS

A preferred embodiment of the invention will now be described with reference to the accompanying drawings wherein:

FIG. 1 is a commonly used timing diagram for a clocked element for a known method of static timing analysis;

FIG. 2 is a conceptual diagram of aggressor wires or nets crossing a victim wire or net, in accordance with the invention;

FIG. 3 is a conceptual timing diagram similar to FIG. 1 but with additional margins added for the clocked timing relationship in accordance with the present invention.

DESCRIPTION OF THE PREFERRED EMBODIMENT

Figure 4:
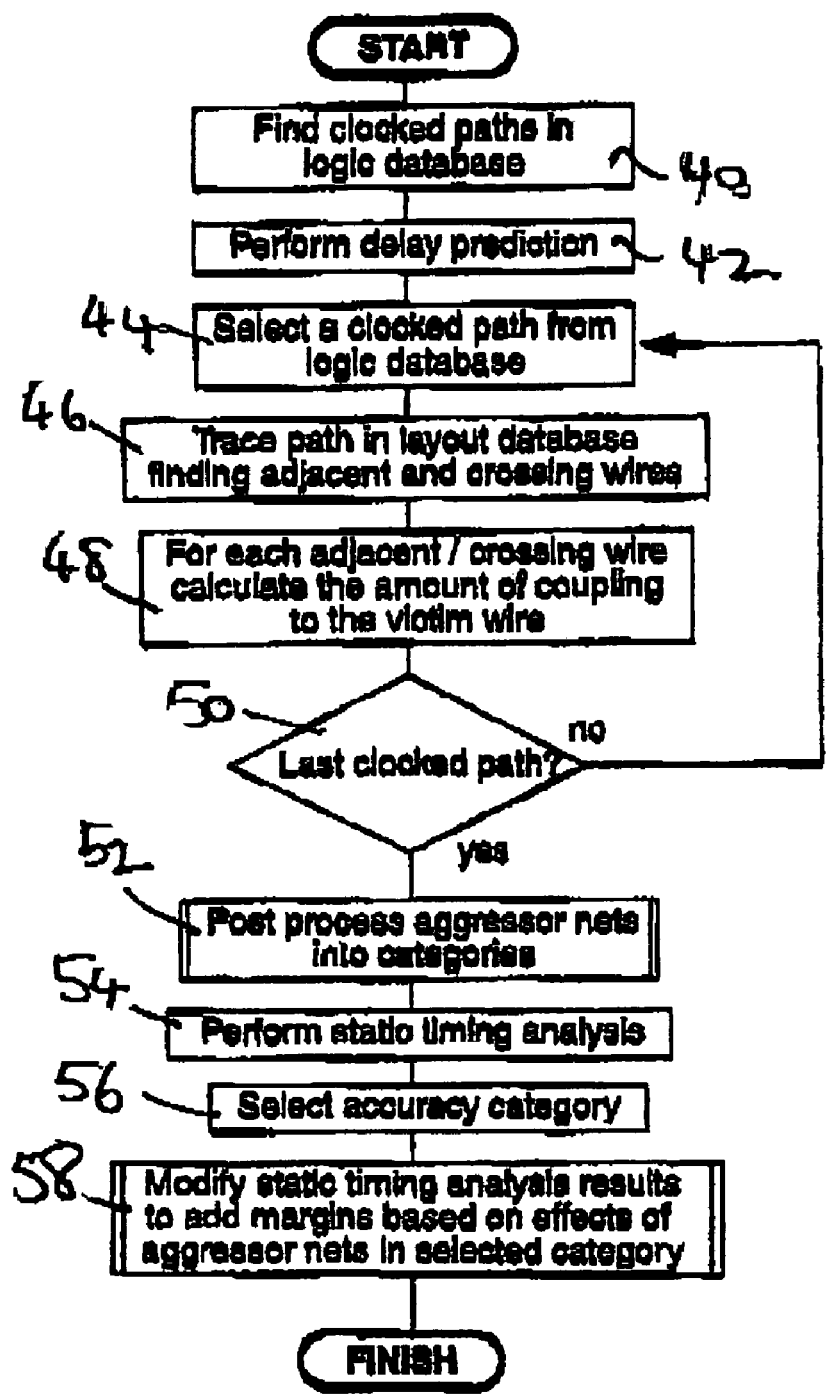
FIGS. 4, 5 and 6 are flow-charts of the method in accordance with the invention.

Referring to FIG. 1, a clocked element 2, e.g. a flip-flop, has a data line 4 and a clock line 6.

As is usual, if data is to be applied on line 4 to the element 2, the data is presented on line 4 well before the occurrence of the clock signal on line 6 in order to ensure that variations in timing do not cause incorrect operation. As can be seen, there is to the left of the rising edge of the clock pulse a time margin based on the set-up time for the circuit, and a time margin to the right of the rising edge of the clock pulse known as the hold time critical region in which operation of element 2 should take place with data present on line 4 and a clock pulse on line 6. Data should be present on line 6 throughout this period.

The apparatus in accordance with the invention, or "tool" operates in several phases, looking at all parts in an integrated circuit which include elements such as that shown in FIG. 1, and the time it takes for signals to travel from one pin of one element to the next.

In accordance with the invention, the topological nature of each signal path is examined, as indicated in FIG. 2, wherein the signal path comprises a wire between components 10, 12, each wire being referred to as victim wire, and the combination of victim wires being referred to as a victim net 14. The victim net is examined, looking at the number of "aggressor wires" 16 crossing and/or running parallel to the victim net to determine the amount of perturbation clocked signals in the aggressor wires would have on the victim net, should the aggressor wires switch at exactly the same time as a signal being transmitted in the victim net.

The actual amount of perturbation (a static timing analysis) is calculated based on the following criteria:
1) Topology of the coupling, i.e. are the wires crossing or in parallel 2) The layer in the semiconductor chip that the wires are on
3) The strength or power of the drivers in the victim and aggressor nets
4) The operating conditions such as process, voltage and temperature
5) The nature of the wire—static/power supply/dynamic Static wires would have no effect so can be discounted from the list. Dynamic wires do have an effect so must be analysed, in terms of their switching in relation to the victim wire. Power supply wires may have an effect. This is hard to quantify due to the complex nature of the switching of the cells attached to the power nets, so for a first order approximation it will be assumed that they do not have any effect.

This gives a worst case situation that assumes each crossing wire is going to cause the maximum amount of impact to the victim wire. This is too pessimistic as it is unlikely that each aggressor wire will switch at exactly the right time to cause perturbation. Therefore, a further processing phase is required to post-process these predictions.

The final phase looks at each aggressor wire and makes an attempt to classify how likely this wire is going to perturb the victim wire. A possible categorisation strategy might be:

Very likely: delay prediction indicates that the aggressor wire may toggle at the same time as the victim wire and that there are few other aggressor wires crossing this aggressor wire so it is fairly certain that it will switch at this time (assumptions are made to make it a first order approximation. Any more would make run times excessive).

Possible: delay prediction indicates that the aggressor wire may toggle at a time near to the victim wire, but the number of aggressor wires crossing this aggressor wire make it hard to predict exactly when it will switch.

Unlikely: Aggressor wire is on a net that cannot switch at a time where it will perturb the victim wire.

Once the categorisation has finished, these effects can be back-annotated onto the traditional static timing analysis as shown in FIG. 3. The degree of effect very likely . . . possible could be selected by the user to trade run times against accuracy.

As indicated in FIG. 3, the categorisation of the aggressor wires leads to the adding of additional margins 30 to the set-up time margin and the hold time critical region margin on either side of the rising edge of the clock pulse.

Figure 5:
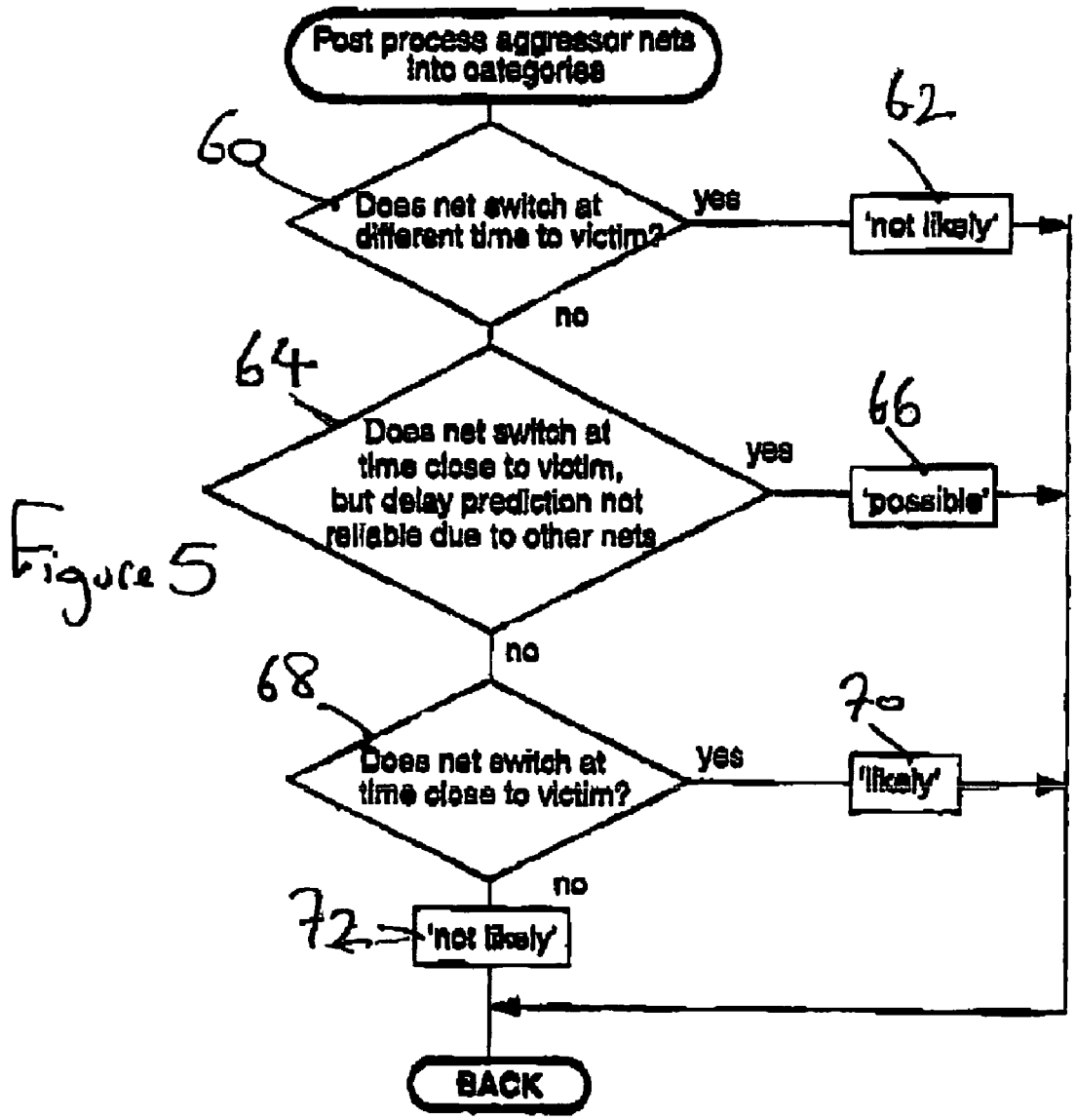
Figure 6:
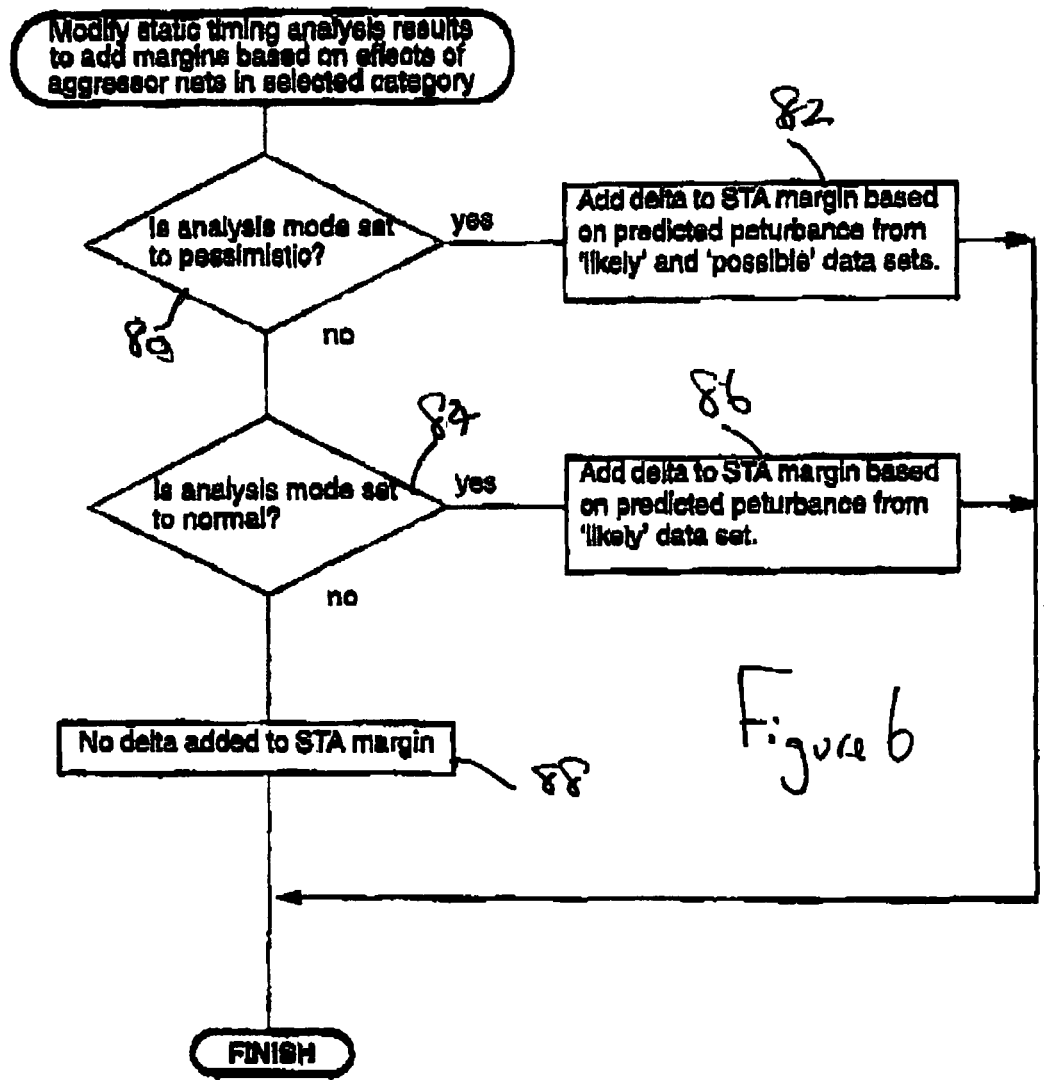

Referring now to the flow chart shown in FIGS. 4, 5 and 6, FIG. 4 shows a general method of operation in accordance with the invention wherein in a first step 40, the various clocked paths in the integrated circuit are determined from a logic data base, each path being termed a signal path or victim net.

In step 42, the delay for a clock pulse passing through the signal path is determined, based on the characteristics of the signal path itself, without reference to external effects.

In step 44, a first signal path is selected, and in step 46 the wires (victim wires) forming the signal path are traced in a layout database of the integrated circuit and adjacent and crossing wires are determined, such wires being defined as aggressor wires.

In step 48, the amount of coupling for each adjacent wire is determined to the victim wires, based on an assumption that clocking occurs in the aggressor wire at the same time as in the victim wire.

In step 50, this procedure is repeated for each signal path in the data base.

In step 52, the aggressor nets are posted into categories for likelihood of affecting switching in the victim wire. In step 54, a timing analysis is carried out, as indicated above with reference to FIG. 2.

In step 56, the degree of accuracy for timing is selected, and in step 58 the static timing analysis resuts are modified to add margins based on the effects of aggressor nets in selected categories.

Step 52 is shown in more detail in FIG. 5. In step 60, it is determined whether in practice the aggressor net will switch at a different time to the victim wires. If the answer is YES, the aggressor wire is posted or flagged as "not likely" to effect the timing of the victim wires as at 62.

If the answer to determination at step 60 is NO, a further determination is made as to whether the aggressor net switches at a time close to the victim net, but because of the presence of other aggressor nets, it is not possible to make an accurate determination of delay prediction. If the answer to this determination is YES, then the aggressor wire is determined as "possible" as at 66, in that it may possibly effect the timing of the victim wires.

If the answer to the determination in step 64 is NO, then a further determination is made as to whether the aggressor of net switches at a time close to the victim net, if the answer to this determination is YES, then the aggressor net is flagged or posted as in "likely", as at 70, to effect the timing of the victim net. If the answer to this determination is NO, then the aggressor net is posted as "not likely" to effect the timing of the victim net, as at 72.

This process is repeated for each aggressor net for any particular victim net, with the result that the aggressor nets are posted into three categories, "likely", "possible", or "not likely" to effect the timing of the victim net.

As shown in FIG. 6, steps 56 and 58 of FIG. 4 are shown in more detail in that margins are added to the clock timing of the victim wire in two selected ranges of accuracy. If as at 80, the analysis mode is set to pessimistic, and all significant effects on timing are to be taken into account, then an interval of time delta is added to the margins indicated in FIG. 3, as at 82, based on predicted perturbance from "likely" and "possible" data sets. If however the only the most significant perturbances are to be taken into account, i.e. a less accurate method of timing analysis, then as at 84, the analysis mode is set to normal, and as at 86 a time interval delta is added to the margins indicated in FIG. 3 based on the predicted perturbance from the "likely" data set, as determined in FIG. 5.

As indicated at 88, if no aggressor net perturbances are to be taken into account, then no timing interval is added to the margins of FIG. 3.

It will be understood that the predicted perturbance to be added to the timing interval will depend on the number of aggressor nets in the "likely" and "possible" data sets and thus the time interval to be added to the margin for timing will be extended based upon known statistical analysis methods. The effect of the number of aggressor nets would be scaled based on the topological and electrical nature of the coupling between two wires. For example, one aggressor wire that is driven by a strong source, such as a clock buffer running parallel a victim wire would have more effect than many aggressor wires running perpendicular to the victim wire (because the parallel wire will have a large coupling). This scaling can be calculated quite simply (for first order approximations), the coupling effect is capacitive and may formulae exist for calculating approximations for wires in different topological configurations.

The electrical impact can be calculated (again as a first order approximation) by using electrical circuit theory, the coupling capacitance and the knowledge of the signal's propagation rate from the design tools' delay predictions that make the starting point for the static analysis algorithms.

It will be understood that the method illustrated in FIGS. 4, 5 and 6 will be carried out on a computer system of the type used in analysis of integrated circuits and that the computer system will have modules added to it corresponding to the various method steps illustrated in FIGS. 4, 5 and 6. Thus, the method disclosed in FIGS. 4 to 6 is equivalent to the disclosure of the apparatus modules to be added to the computer system.

The invention claimed is:

1. A method of determining the timing for a synchronous integrated circuit, the circuit including a multiplicity of clocked elements interconnected by signal paths, the method comprising:
   1) Forming predictions for timing delays in said signal paths in the integrated circuit;
   2) Selecting a first such path, tracing wires in the integrated circuit forming the path, hereinafter referred to as victim wires, and determining adjacent and crossing wires thereto, hereinafter referred to as aggressor wires;
   3) For each aggressor wire, determining the amount of electromagnetic coupling to the victim wires of the first path;
   4) Dividing the aggressor wires into a plurality of categories depending on the clocked timing of the aggressor wires in relation to the clocked timing of the victim wires;
   5) Allowing a user to select a mode of operation; and
   6) For each victim wire, modifying the predictions formed in step (1) based on the effects of the aggressor wires only in those categories corresponding to the mode of operation selected by the user.

2. A method according to claim 1, wherein step (3) is carried out taking into account one or more of the following factors:
   a) whether the aggressor wire crosses or runs parallel to the victim wire;
   b) the signal strengths in the victim and aggressor wires;
   c) the layers in the integrated circuit which the wires are disposed; and
   d) what type of signal is carried on the aggressor wire.

3. A method according to claim 1 wherein the aggressor wires are divided into the plurality of categories in step (4) based on a likelihood that they will perturb a given victim wire.

4. A method according to claim 1, wherein the aggressor wires are divided into three categories of likely, possible or unlikely to affect the timing of the victim wire.

5. A method according to claim 4, wherein the mode of operation selected by the user causes only the effects of the aggressor wires in the likely category to be taken into account.

6. A method according to claim 4, wherein the mode of operation selected by the user causes only the effects of the aggressor wires in the likely and possible categories to be taken into account.

7. A method according to claim 4, wherein the mode of operation selected by the user causes the effects of the aggressor wires in none of the categories to be taken into account.

8. A method according to claim 4, wherein the effects of aggressor wires in any category are scaled according to their respective electrical signal coupling with the victim wire.

9. A method according to claim 1 wherein the predictions are modified in step (6) by adding a margin of error to the timing delay predicted for a corresponding victim wire in step (1).

10. A method according to claim 9 wherein the margin of error depends upon a number of the aggressor wires in each of the categories corresponding to the mode of operation selected by the user.

11. A method according to claim 9 wherein the margin of error depends upon the amount of electromagnetic coupling of the aggressor wires in each of the categories corresponding to the mode of operation selected by the user.

12. An apparatus for determining the timing of a synchronous integrated circuit, the circuit including a multiplicity of clocked elements interconnected by signal paths, the apparatus comprising:
   1) Means for forming predictions for timing delays in said signal paths in the integrated circuit;
   2) Means for selecting a first such path, tracing wires in the integrated circuit forming the path, hereinafter referred to as victim wires, and determining adjacent and crossing wires thereto, hereinafter referred to as aggressor wires;
   3) Means for determining the amount of electromagnetic coupling, for each aggressor wire, to the victim wires of the first path;
   4) Means for dividing the aggressor wires into a plurality of categories depending on the clocked timing of the aggressor wires in relation to the clocked timing of the victim wires;
   5) Means for allowing a user to select a mode of operation; and
   6) Means for modifying the predictions formed in step (1), for each victim wire, based on the effects of the aggressor wires only in those categories corresponding to the mode of operation selected by the user.

13. An apparatus according to claim 12 wherein the aggressor wires are divided into the plurality of categories by said means (4) based on a likelihood that they will perturb a given victim wire.

14. An apparatus according to claim 12 wherein the predictions are modified in step (6) by adding a margin of error to the timing delay predicted for a corresponding victim wire by said means (1).

15. An apparatus according to claim 14 wherein the margin of error depends upon a number of the aggressor wires in each of the categories corresponding to the mode of operation selected by the user.

16. An apparatus according to claim 14 wherein the margin of error depends upon the amount of electromagnetic coupling of the aggressor wires in each of the categories corresponding to the mode of operation selected by the user.

* * * * *